(12) United States Patent
Kawaguchi et al.

(10) Patent No.: US 10,506,749 B2
(45) Date of Patent: Dec. 10, 2019

(54) ELECTRONIC COMPONENT MOUNTING SYSTEM

(71) Applicants: ETEL S.A., Motiers (CH); FUJI CORPORATION, Chiryu-shi (JP)

(72) Inventors: Koji Kawaguchi, Chiryu (JP); Fredrik Arnell, Upplands Vaesby (SE); Marc Kunze, Chavornay (CH); Bruno Chichiricco, La Cluse-et-Mijoux (FR)

(73) Assignees: ETEL S.A., Motiers (CH); FUJI CORPORATION, Chiryu-Shi (JP)

( * ) Notice: Subject to any disclaimer, the term of this patent is extended or adjusted under 35 U.S.C. 154(b) by 148 days.

(21) Appl. No.: 15/309,226

(22) PCT Filed: May 13, 2014

(86) PCT No.: PCT/EP2014/059758
§ 371 (c)(1),
(2) Date: Nov. 7, 2016

(87) PCT Pub. No.: WO2015/172817
PCT Pub. Date: Nov. 19, 2015

(65) Prior Publication Data
US 2017/0079168 A1    Mar. 16, 2017

(51) Int. Cl.
*B23P 19/00* (2006.01)
*H05K 13/04* (2006.01)
*H05K 13/08* (2006.01)

(52) U.S. Cl.
CPC ....... *H05K 13/0413* (2013.01); *H05K 13/041* (2018.08); *H05K 13/08* (2013.01); *Y10T 29/53174* (2015.01)

(58) Field of Classification Search
CPC ......... Y10T 29/53178; Y10T 29/53191; Y10T 29/4913; Y10T 29/49131; Y10T 29/53174;

(Continued)

(56) References Cited

U.S. PATENT DOCUMENTS

| | | | | |
|---|---|---|---|---|
| 4,794,689 A | * | 1/1989 | Seno | ........ H05K 13/0452 29/740 |
| 5,313,401 A | * | 5/1994 | Kasai | ........ H05K 13/021 700/160 |

(Continued)

FOREIGN PATENT DOCUMENTS

| | | |
|---|---|---|
| CN | 101869012 A | 10/2010 |
| EP | 0845934 B1 | 6/1998 |

(Continued)

*Primary Examiner* — Thiem D Phan
(74) *Attorney, Agent, or Firm* — Leydig, Voit & Mayer, Ltd.

(57) ABSTRACT

A system for mounting electronic components on a substrate includes component holders each configured to hold an electronic components to be mounted on the substrate. A revolving device is configured to revolve the component holders along a pre-determined path so that each one of the component holders is moveable into a component receiving location for receiving a respective electronic component and/or a component mounting location for mounting the respective electronic component on the substrate. An actuator is configured to actuate a respective component holder in the component receiving location and/or the component mounting location. A safety device is configured to determine whether the respective component holder to be actuated by the actuator is properly placed in an operative position on the revolving device. The safety device is arranged separately from the actuator and is spaced apart from the actuator along the pre-determined path.

10 Claims, 2 Drawing Sheets

(58) Field of Classification Search
CPC .......... Y10T 29/49133; Y10T 29/5137; Y10T 29/53052; Y10T 29/5313; Y10T 29/53261; H05K 13/041; H05K 13/0413; H05K 13/0452; H05K 13/08; H05K 13/02; H05K 13/0015; H05K 13/0061; H01R 12/716
USPC .......... 29/740, DIG. 44, 739, 705, 743, 829, 29/832, 834, 837; 198/470.1, 471.1, 198/468.4
See application file for complete search history.

(56) References Cited

U.S. PATENT DOCUMENTS

| | | | |
|---|---|---|---|
| 5,661,239 | A | 8/1997 | Takeuchi |
| 6,161,277 | A | 12/2000 | Asai et al. |
| 6,378,198 | B1 * | 4/2002 | Asai ............ H05K 13/0061 29/825 |
| 6,678,944 | B1 | 1/2004 | Kawada |
| 7,032,303 | B2 | 4/2006 | Kawada |

FOREIGN PATENT DOCUMENTS

| | | |
|---|---|---|
| EP | 1041870 A2 | 10/2000 |
| JP | H 03195099 A | 8/1991 |
| JP | H 093659 A | 2/1997 |
| JP | 2774338 B2 | 7/1998 |
| WO | WO 2009066592 A1 | 5/2009 |

* cited by examiner

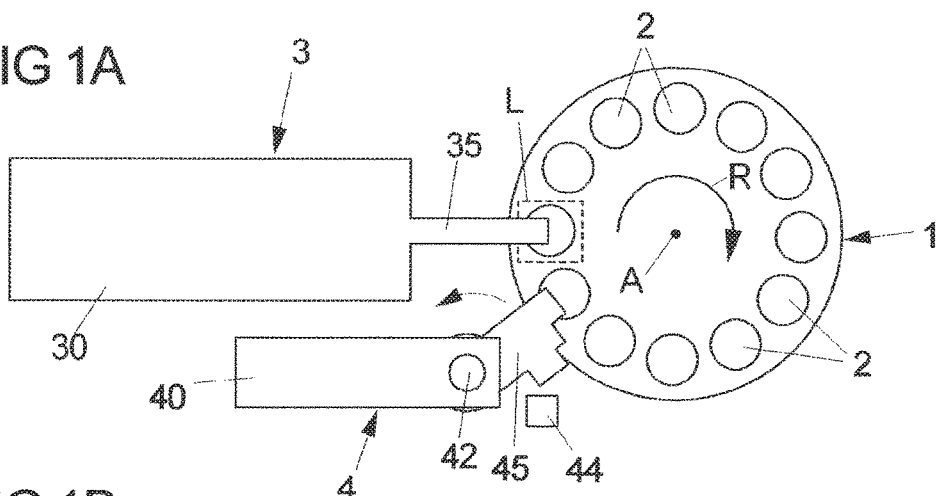
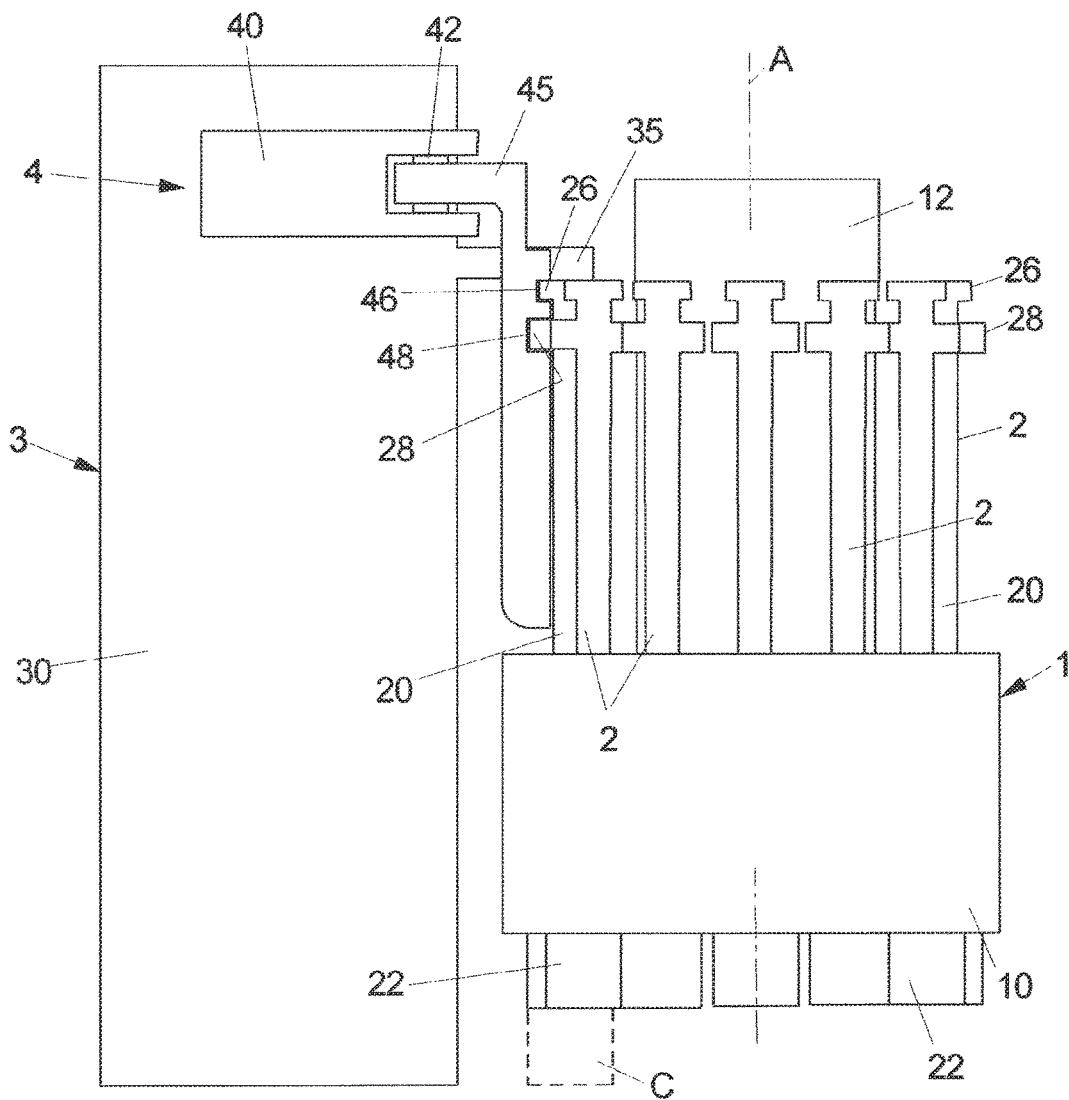

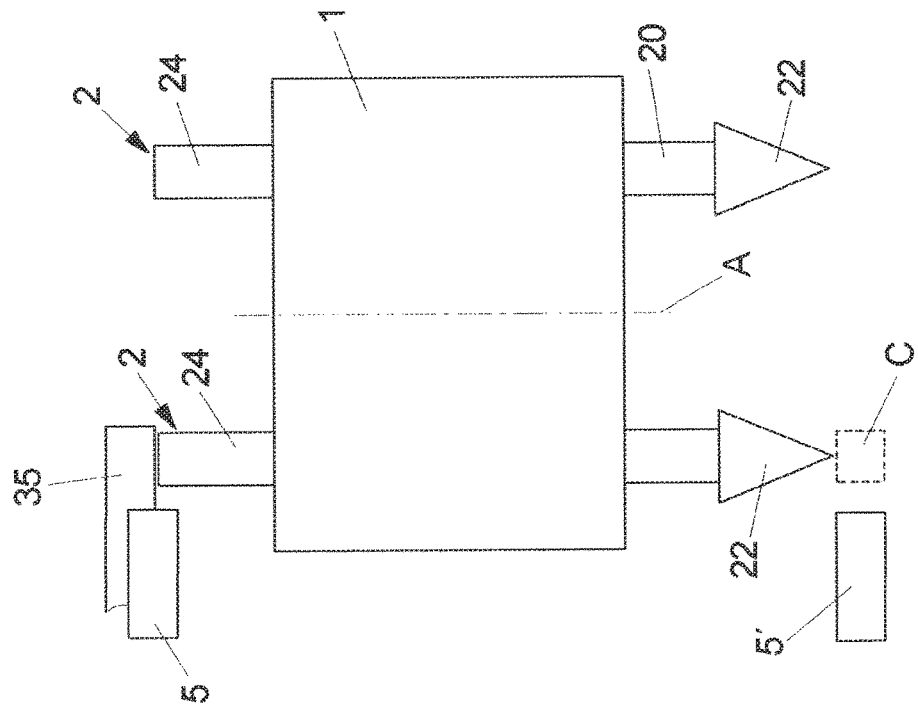
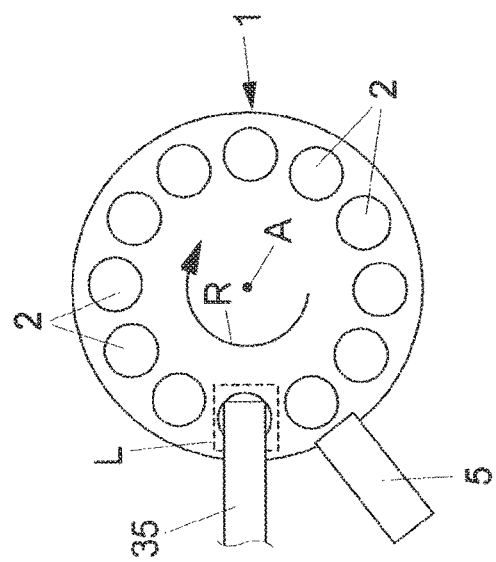

ELECTRONIC COMPONENT MOUNTING SYSTEM

CROSS-REFERENCE TO PRIOR APPLICATION

This application is a U.S. National Stage Application under 35 U.S.C. § 371 of International Application No. PCT/EP2014/059758 filed on May 13, 2014. The International Application was published in English on Nov. 19, 2015 as WO 2015/172817 A1 under PCT Article 21(2).

FIELD

The invention relates to a system for mounting electronic components such as integrated circuit components on a substrate such as a printed circuit board.

BACKGROUND

WO 2009/066592 A1 describes system that comprises a plurality of component holders each of which is provided to hold at least one electronic component to be mounted on a substrate as well as a revolving device which is provided to revolve the component holders along a pre-determined path, e.g., to rotate the component holders about an axis of rotation, such that each component holder can be brought into a component receiving position for receiving an electronic components and/or into a component mounting position for mounting an electronic component on the substrate, the component receiving position and the component mounting position being arranged on a locus of said pre-determined path. Furthermore, the system comprises an actuator for actuating a component holder in the component receiving position in order to attach an electronic component to the component holder and/or in the component mounting position in order to mount an electronic component on the substrate.

A further component mounting system is known from EP 0 845 934 B1. The actuator of the known system is provided with a safety device for determining whether a component holder to be actuated is properly placed on the revolving device for actuation by the actuator. This serves to avoid a possible collision between a misaligned component holder and the actuator. For example, a displacement of a component holder can occur when the component holder does not return to its initial position on the revolving device after actuation. However, the dynamics of the actuator while in operation may be impaired by the safety device.

SUMMARY

In an embodiment, the present invention provides a system for mounting electronic components on a substrate. A plurality of component holders are each configured to hold at least one of the electronic components to be mounted on the substrate. A revolving device is configured to revolve the component holders along a pre-determined path so that each one of the component holders is moveable into at least one of a component receiving location for receiving a respective one of the electronic components or a component mounting location for mounting the respective one of the electronic components on the substrate. An actuator is configured to actuate a respective one of the component holders in the at least one of component receiving location or the component mounting location. A safety device is configured to determine whether the respective one of the component holders to be actuated by the actuator is properly placed in an operative position on the revolving device. The safety device is arranged separately from the actuator and is spaced apart from the actuator along the pre-determined path.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 1A shows a top view of a first embodiment of an electronic component mounting system;

FIG. 1B shows a side view of the electronic component mounting system according to FIG. 1A;

FIG. 2A shows a top view of a second embodiment of an electronic component mounting system;

FIG. 2B shows a side view of the electronic component mounting system according to FIG. 2A.

DETAILED DESCRIPTION

In an embodiment, the invention improves the above-described electronic component mounting system by avoiding an impairment of the actuator by the safety device.

According to an embodiment of the invention, the safety device is designed separately from the actuator and is spaced apart from the actuator. By separating the safety device from the actuator, the operation of the actuator is not impaired by the safety device.

In particular, the safety device is spaced apart from the actuator in such a manner that a possible displacement of a component holder can be detected by the safety device before the component holder reaches the actuator during a revolution of the revolving device. To this end, the safety device can be arranged adjacent to the actuator, taking into account the direction of motion of the revolving device.

The component holders can be arranged on the revolving device such that they are movable up and down relative to the revolving device, and the actuator can be designed as an elevating and/or lowering device which elevates or lowers a respective component holder in the component receiving position or the component mounting position. As a result thereof the component holder receives an electronic component and/or places an electronic component on a substrate.

Each component holder is configured such that it is bound to return to its initial position on the revolving device (operative position) after actuation if the system works properly. This can be achieved due to an impact by the actuator and/or by biasing each component holder into its operative position by elastic means such as a spring or by another driving mechanism. For example, the component holder may be returned to its operative position by the actuator and then kept in this position by the elastic means. In case of a component holder that is mounted on the revolving device to be movable up and down with respect to the revolving device the component holder returns to its operative height after actuation.

The safety device may be realized by a position detector to detect a displacement of a component holder from its operative position on the revolving device.

According to one embodiment of the invention, the safety device comprises a mechanical position detector for mechanically screening the position of a component holder on the revolving device. The mechanical position detector may comprise a movable part, the movable part on the one hand and a respective component holder on the other hand being formed such that a cutout and a corresponding protrusion engage each other if the component holder is properly placed in its operative position on the revolving device. Conversely, if the component holder is displaced with respect to its operative position, this will cause a deflection of the movable part. Thus, a collision between the component holder and the actuator can be avoided by stopping the revolving device.

The movable part of the position detector may be a lever that is swivel-mounted to the position detector. A suitable sensor, such as a photoelectric barrier or a potentiometer, may be used to detect a deflection of the movable part.

According to another embodiment of the invention, the position detector is provided in the form of a contactless detector, such as a contactless sensor or a camera. A camera cannot only detect the position of a component holder, but it may also be used to investigate whether an electronic component is attached to a component holder.

According to FIGS. 1A and 1B a system for mounting electronic components C on a substrate (rotating pick and place apparatus) comprises a revolving device 1 which pivots around an axis A, a plurality of component holders 2 (component disposing elements) which are movably mounted on the revolving device 1, and an actuator 3 for actuating a respective component holder 2 so that an electronic component C attached to the component holder 2 is placed on a substrate such as a printed circuit board.

The revolving device 1 has a base portion 10 receiving the component holders 2 and a driving portion 12 for connecting the revolving device 1 to a power unit driving the revolving device 1 such that it performs a rotation R about the axis A.

Each component holder 2 is mounted to the revolving device 1 in such a manner that it is movable with respect to the revolving device in a longitudinal direction, e.g., along the axis of rotation A of revolving device 1. In other words, according to the embodiment shown in FIGS. 1A and 1B the component holders 2 can be moved up and down with respect to the revolving device 1.

The component holders 2 are distributed on the revolving device 1 along its direction of rotation R and are spaced apart from each other. Each component holder 2 comprises a mounting portion 20 for movably mounting the respective component holder 2 to the revolving device 1 and a holding portion 22 for attaching an electronic component C.

Opposite to the holding portion 22, circumferential projections 26, 28 are provided on each component holder 2. These serve to detect a possible displacement of a component holder 2 with respect to its operative position on revolving device 1; the operative position being defined as a position in which a respective component holder 2 may be properly actuated by the actuator 3 or, more precisely, by an actuating lever 35 of actuator 3 which is mounted on a base body 30 of actuator 3.

In order to be actuated by actuator 3, a component holder 2 has to be brought into a component mounting location L by a rotation of revolving device 1 (about its axis of rotation A). In its component mounting location L a respective component holder 2 is coupled to the actuator 3 or, more precisely, to its actuating lever 35. Thus, the component holder can be actuated by actuator 3 such that an electronic component C attached to the component holder 2 is placed on a substrate, e.g., a printed circuit board—provided that the component holder 2 is properly placed in its operative position on revolving device 1. (The electronic component C has to be attached to the component holder 2 at some component receiving location which may be the same as the component mounting location or which may be a separate location.) After placement of the electronic component C, the component holder 2 is returned to its operative position, e.g. by actuator 3. To this end, actuating lever 35 may be provided with an engagement portion, such as a fork-shaped portion, by means of which it engages the component holder 2 in order to move it down or up, respectively.

A system for mounting electronic components on a substrate in form of a rotating pick and place apparatus is known from the prior art, for example from WO 2009/066592 A1 or EP 0 845 934 B1.

In FIGS. 1A and 1B, the component holders 2 are shown in their respective operative position in which they can be actuated by the actuator 3 through its actuating lever 35, as illustrated in FIG. 1B, after having been brought into the component mounting location L indicated in FIG. 1A. An actuation of a component holder 2 by actuator 3 leads to a movement of the respective component holder 2 downwards along the axis of rotation A. Due to such downward movement the electronic component C attached to a respective component holder 2 can be mounted on a substrate which is located below the component holders 2. Thereafter, the component holder 2 shall return to its initial position/operative position. This can be achieved by an elastic force produced by a spring or by a driving mechanism.

It is important to ensure that a respective component holder 2 is indeed positioned in its operative position when it reaches the component mounting location L. A displacement of a component holder 2 with respect to its operative position may not only lead to a malfunction of the system but also to a collision with the actuator 3, potentially damaging its actuating lever 35.

In order to detect a possible displacement of a component holder 2 with respect to its operative position, a safety device 4 is provided adjacent to actuator 3. The safety device 4 is separated from actuator 3 and is spaced apart from actuator 3 along the direction of rotation R of revolving device 1.

The safety device 4 is a mechanical position detector for mechanically screening the position of a respective component holder 2 before it reaches its component mounting location L during a rotation of revolving device 1. The safety device 4 comprises a movable part 45 which is movably attached to a base body 40 of safety device 4. According to the embodiment shown in FIGS. 1A and 1B, movable part 45 is formed by a lever which is swivel-mounted to the base body 40 so that it can pivot about an axis 42. In general, movable part 45 can also be movable along a non-circular path.

As can be seen from FIG. 1B, movable part 45 comprises cutouts 46, 48 which are engaged by the projections 26, 28 of a component holder 2 which is just about to reach the component mounting location L—if the respective component holder 2 is properly placed in its operative position.

On the other hand, if the component holder 2 interacting with the safety device 4 is displaced with respect to its operative position (e.g., along the axis A), then the projections 26, 28 of component holder 2 will not engage the cutouts 46, 48 of movable part 45. This will cause a deflection of movable part 45 relative to base body 40 due to a collision of movable part 45 with the displaced component holder 2. Specifically, in the embodiment shown in FIGS. 1A and 1B, movable part 45 will be rotated about the axis 42 as indicated by an arrow in FIG. 1A. A deflection of movable part 45 may be detected by any suitable sensor 44, such as a light barrier, a potentiometer etc.

The deflection of movable part 45 indicates that the component holder 2 currently interacting with movable part 45 is displaced with respect to its operative position. As a consequence, a rotation of revolving device 1 can be stopped in order to avoid a collision between the respective component holder 2 and the actuator 3.

Movable part 45 of safety device 4 may be biased towards its starting position by elastic means, such as a spring, so that it returns to its starting position after an interaction with a displaced component holder 2.

As the safety device 4 is physically separated and spaced apart from actuator 3 it does not interfere with the operation of actuator 3 that consists in actuating a component holder 2 located in the component mounting location L.

According to another embodiment of the invention which is shown in FIGS. 2A and 2B, the safety device 5 is formed by a contactless position detector such as a sensor or a camera. Apart from the design of the safety device, this embodiment is identical to the system shown in FIGS. 1A and 1B. Therefore, reference is made to the description of FIGS. 1A and 1B with respect to the remaining elements of the electronic component mounting system of FIGS. 2A and 2B. For facility of inspection of the Drawings, only a portion of actuator 3 is displayed in FIGS. 2A and 2B.

The safety device 5 in form of a contactless detector serves to detect a displacement of a component holder 2 before it reaches the component mounting location L. As in the embodiment of FIGS. 1A and 1B, such displacement will typically occur in the form of a vertical displacement of a component holder 2 along the axis of rotation A, in particular, if a component holder 2 does not return to its operative position after actuation. The contactless position detector may be realized by a sensor such as a photoelectric sensor, a capacitive sensor etc.

According to FIG. 2B, the safety device 5 in form of a contactless position detector is arranged to detect a possible displacement of a component holder 2 at an end portion 24 of the component holder 2 facing away from its holding portion 22.

Alternatively, as also indicated in FIG. 2B, a safety device 5' in form of a contactless position detector may be arranged such that it detects a displacement of a component holder 2 at its holding portion 22. If the safety device 5' comprises a camera, it may not only be used to detect a displacement of a component holder 2 but also to check whether an electronic component C is attached to the component holder 2.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A system for mounting a plurality of electronic components on a substrate, comprising:
   a plurality of component holders each configured to hold at least one of the electronic components to be mounted on the substrate,
   a revolving device configured to revolve the component holders along a pre-determined path so that each one of the component holders is moveable into at least one of:
      a component receiving location for receiving a respective one of the electronic components, or
      a component mounting location for mounting the respective one of the electronic components on the substrate,
   an actuator configured to actuate a respective one of the component holders in the at least one of the component receiving location or the component mounting location, and
   a safety device comprising a mechanical position detector configured to mechanically screen a position of the respective one of the component holders on the revolving device so as to determine whether the respective one of the component holders to be actuated by the actuator is properly placed in an operative position on the revolving device, the safety device being arranged separately from the actuator and being spaced apart from the actuator along the pre-determined path, wherein the safety device comprises a movable part configured to be moved by engagement with a circumferential projection or a cutout of the respective one of the component holders which is not properly placed in the operative position.

2. The system according to claim 1, wherein the safety device is arranged separately from the actuator in such a manner that operation of the actuator during actuation of the respective one of the component holders is not impaired by the safety device.

3. The system according to claim 1, wherein the safety device is spaced apart from the actuator in such a manner, and is configured such that, a position of the respective one of the component holders is determinable by the safety device before the respective one of the component holders reaches the actuator during a revolution of the revolving device.

4. The system according to claim 1, wherein the safety device is arranged adjacent to the actuator.

5. The system according to claim 1, wherein the respective one of the component holders is designed to return to the operative position after actuation by the actuator.

6. The system according to claim 1, wherein the component holders are mounted on the revolving device so as to be movable up and down along an axis of rotation of the revolving device.

7. The system according to claim 6, wherein the component holders are designed to return to a level along the axis of rotation corresponding to an operative position of the component holders.

8. The system according to claim 1, wherein the safety device comprises a position detector.

9. The system according to claim 1, wherein the movable part is formed by a lever that is swivel-mounted on a base body of the safety device.

10. The system according to claim 1, further comprising a sensor configured to detect the movement of the movable part.

\* \* \* \* \*